(12) United States Patent
Gong et al.

(10) Patent No.: US 12,062,998 B2
(45) Date of Patent: Aug. 13, 2024

(54) REMOTE CONTROL DEVICE, PIEZOELECTRIC LASER POINTER, AND REMOTE CONTROL SYSTEM

(71) Applicant: Shihezi University, Shihezi (CN)

(72) Inventors: Lijiao Gong, Shihezi (CN); Chunming Zhao, Shihezi (CN); Tianshuo Zhou, Shihezi (CN); Hongwei Li, Shihezi (CN); Jindong Si, Shihezi (CN); Xin Zhang, Shihezi (CN); Yibo Li, Shihezi (CN); Weiwei Hou, Shihezi (CN); Shilong Qiu, Shihezi (CN); Jianxin Yang, Shihezi (CN); Xingyi Chen, Shihezi (CN)

(73) Assignee: Shihezi University, Shihezi (CN)

( * ) Notice: Subject to any disclaimer, the term of this patent is extended or adjusted under 35 U.S.C. 154(b) by 891 days.

(21) Appl. No.: 17/119,229

(22) Filed: Dec. 11, 2020

(65) Prior Publication Data
US 2021/0203254 A1 Jul. 1, 2021

(30) Foreign Application Priority Data
Dec. 31, 2019 (CN) .......................... 201911401804.1

(51) Int. Cl.
*H02N 2/18* (2006.01)
*H01S 3/02* (2006.01)
*H04N 21/41* (2011.01)
*H10N 30/30* (2023.01)

(52) U.S. Cl.
CPC ............. *H02N 2/186* (2013.01); *H01S 3/025* (2013.01); *H04N 21/41265* (2020.08); *H10N 30/30* (2023.02)

(58) Field of Classification Search
CPC .. H02N 2/186; H10N 30/30; H04N 21/41265; H01S 3/025
See application file for complete search history.

(56) References Cited

FOREIGN PATENT DOCUMENTS

| AU | 2021101797 A4 | * | 5/2021 |
| CN | 101994672 A | * | 3/2011 |
| CN | 102386804 A | | 3/2012 |

(Continued)

*Primary Examiner* — J. San Martin
(74) *Attorney, Agent, or Firm* — Mark C. Johnson; Johnson |Dalal

(57) ABSTRACT

The disclosure provides a remote control device, a piezoelectric laser pointer, and a remote control system. The remote control device includes a housing, and further includes: a power generator, mounted inside the housing and including a press mechanism and a power generating mechanism, where after being pressed by the press mechanism, the power generating mechanism is deformed under stress and generates electricity; a circuit controller, mounted inside the housing and electrically connected to the power generator; and a signal transceiver, mounted inside the housing, electrically connected to the circuit controller, and configured to transmit and receive signals. In the disclosure, the power generating mechanism generates power after being pressed by the press mechanism, and the power is transferred to the circuit controller, so that the signal transceiver is powered on. Dry batteries are no longer used, thus avoiding environmental pollution caused by used dry batteries.

14 Claims, 4 Drawing Sheets

(56) References Cited

FOREIGN PATENT DOCUMENTS

| CN | 109495012 A | * | 3/2019 |
| CN | 111082702 B |   | 3/2021 |
| JP | 2003116285 A | * | 4/2003 |

* cited by examiner

REMOTE CONTROL DEVICE, PIEZOELECTRIC LASER POINTER, AND REMOTE CONTROL SYSTEM

TECHNICAL FIELD

The disclosure relates to the technical field of vibration power generation, and in particular, to a remote control device, a piezoelectric laser pointer, and a remote control system.

BACKGROUND

Remote control devices, such as a TV remote control, a fan remote control, an air conditioner remote control and a multimedia remote control, are used extremely frequently in modern life. Remote controls allow people to control electric devices at a remote distance, and are easy and convenient to use.

In daily life, most remote control devices use dry batteries as power supplies. However, dry batteries have a short service life, and need to be discarded when they run out. Although rechargeable batteries may be used continuously, they also need to be discarded after the service life comes to an end. Moreover, the rechargeable batteries further need to be equipped with special chargers, and are inconvenient to use.

Existing remote control devices use dry batteries as power supplies. After being used, the discarded dry batteries pollute the environment. Besides, after the dry batteries are carelessly discarded, toxic substances therein get into the soil and destroy the soil, and even get into human bodies through various means to harm the human bodies eventually.

SUMMARY

The disclosure aims to provide a remote control device, to solve the problem that existing remote control devices use dry batteries as power supplies, and after being used, the discarded dry batteries pollute the environment; besides, after the dry batteries are carelessly discarded, toxic substances therein get into the soil and destroy the soil, and even get into human bodies through various means to harm the human bodies eventually.

The disclosure is implemented as follows: A remote control device, including a housing, where the remote control device further includes:

a power generator, mounted inside the housing and including a press mechanism and a piezoelectric power generating mechanism, where after being pressed by the press mechanism, the piezoelectric power generating mechanism is deformed under stress and generates electricity;

a circuit controller, mounted inside the housing and electrically connected to the power generator; and a signal transceiver, mounted inside the housing, electrically connected to the circuit controller, and configured to transmit and receive signals.

Another objective of the examples of the disclosure is to provide a piezoelectric laser pointer, including a housing, where the piezoelectric laser pointer further includes:

a piezoelectric power generator, mounted inside the housing and including a press mechanism and a piezoelectric power generating mechanism, where after being pressed by the press mechanism, the piezoelectric power generating mechanism is deformed under stress and generates electricity;

a circuit controller, mounted inside the housing, electrically connected to the power generator, and electrically connected with an on-off key;

a signal transceiver, mounted inside the housing, electrically connected to the circuit controller, and configured to transmit signals, where the signal transceiver includes a USB receiver configured to receive signals; and a laser emitter, mounted on the housing and electrically connected to the circuit controller, where a display screen is mounted on the surface of the housing.

Another objective of the disclosure is to provide a remote control system, including:

a multimedia device; and the remote control device or the piezoelectric laser pointer described above, where the remote control device or the piezoelectric laser pointer is wirelessly connected to the multimedia device, and the remote control device is configured to wirelessly control the multimedia device.

The disclosure provides a remote control device. The device abandons the conventional method of power supply with dry batteries. The power generator is arranged in the remote control device. The power generator works based on the following principle: the piezoelectric power generating mechanism generates power after being pressed by the press mechanism. By using an energy harvesting technology, power is transferred to the circuit controller, to provide power for the signal transceiver, so as to start a corresponding electric appliance and perform a corresponding remote control operation. Dry batteries are no longer used, thus avoiding environmental pollution caused by used dry batteries. The disclosure does not pollute the environment, and therefore does not cause any harm to human bodies.

Figure 1:
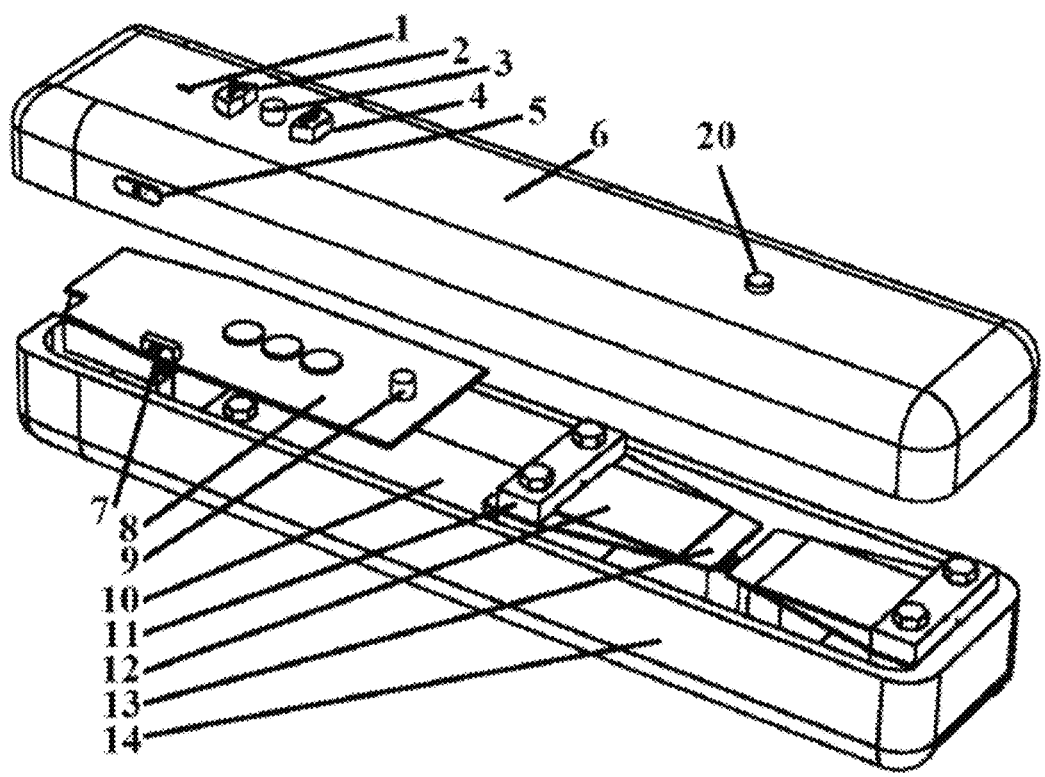
FIG. 1 is an overall structural diagram of a remote control device according to an example of the disclosure.

In the drawings: 1-display screen; 2-first key; 3-second key; 4-third key; 5-on-off key; 6-upper housing; 7-fourth key; 8-laser pointer circuit board; 9-bolt; 10-power supply control circuit board; 11-cantilever beam press plate; 12-piezoelectric patch; 13-cantilever beam; 14-lower housing; 15-electrode lead; 16-spring A; 17-spring-A sleeve; 18-ball; 19-laser pointer receiver; 20-piezoelectric button; 21-spring B; 22-spring-B sleeve; 23-spring-C sleeve; 25-button support frame; 26-spring C.

DETAILED DESCRIPTION

To make the objectives, technical solutions, and advantages of the disclosure clearer, the following further describes the disclosure in detail with reference to the accompanying drawings and examples. It should be understood that the specific examples described herein are merely illustrative of the disclosure and are not intended to limit the disclosure.

The specific implementation of the disclosure is described in detail below with reference to the accompanying drawings and specific examples.

FIG. 1 is a structural diagram of a remote control device according to an example of the disclosure. The remote control device includes a housing, and further includes: a power generator, mounted inside the housing and comprising a press mechanism and a piezoelectric power generating mechanism, wherein after being pressed by the press mechanism, the piezoelectric power generating mechanism is deformed under stress and generates electricity;

a circuit controller, mounted inside the housing and electrically connected to the power generator; and a signal transceiver, mounted inside the housing, electrically connected to the circuit controller, and configured to transmit and receive signals.

In the example of the disclosure, when using the remote control device, a user presses the press mechanism of the power generator. The press mechanism transfers pressure to the piezoelectric power generating mechanism. The piezoelectric power generating mechanism generates electricity and transfers the electricity to the circuit controller. The circuit controller is a power supply control circuit board 10. Through a parallel synchronized switch harvesting on inductor circuit, a rectification circuit and a storage circuit, the power supply control circuit board 10 is powered on, thereby providing power for the signal transceiver. The signal transceiver includes a signal transmitter and a signal receiver. The user controls, through disposed keys connected to the circuit controller, the remote control device to perform a remote control operation.

An example of the disclosure provides a remote control device. The remote control device is used based on the principle of generating power by pressure, and is no longer equipped with dry batteries, thus avoiding the problem of environmental pollution caused by used dry batteries discarded carelessly. As no dry battery needs to be equipped, the device may have a smaller size. The device is light and portable.

As shown in FIG. 1, in an example of the disclosure, a plurality of keys are mounted on the surface of the housing, a plurality of corresponding contacts are mounted on the circuit controller, and the keys are electrically connected to the circuit controller through the contacts. The keys include a first key 2, a second key 3, a third key 4, and a fourth key 7. Magnetic reed switches are mounted at tails of the keys.

In the example of the disclosure, the user presses a corresponding key, to control the remote control device to perform a corresponding operation, for example, turning on or turning off the remote control device, or controlling PPT page turning of a player by using the remote control device.

The examples of the disclosure provide a remote control device. The user may directly control a corresponding multimedia device through the keys of the remote control device. In this way, the user can conveniently control playing of the multimedia device, which facilitates teaching.

In a preferred example of the disclosure, the press mechanism includes a press element and a reset element.

In the example of the disclosure, the press element and the reset element jointly form a press mechanism, a pressure can be generated once the press element is pressed, and the pressure is transferred. The press element moves downward after being pressed, and the reset element is deformed under stress. After the pressure disappears, the reset element may reset, so that the press element also returns to its original position. After the press element is pressed to cause the piezoelectric power generating mechanism to generate electricity, the user may stop pressing the press element, and the reset element may drive the press element to return to the original position.

The examples of the disclosure provide a remote control device. After the press element is pressed, if the pressing stops, the press element may restore the original state due to a resetting function of the reset element, so that the remote control device is simple and convenient to use.

Figure 3:
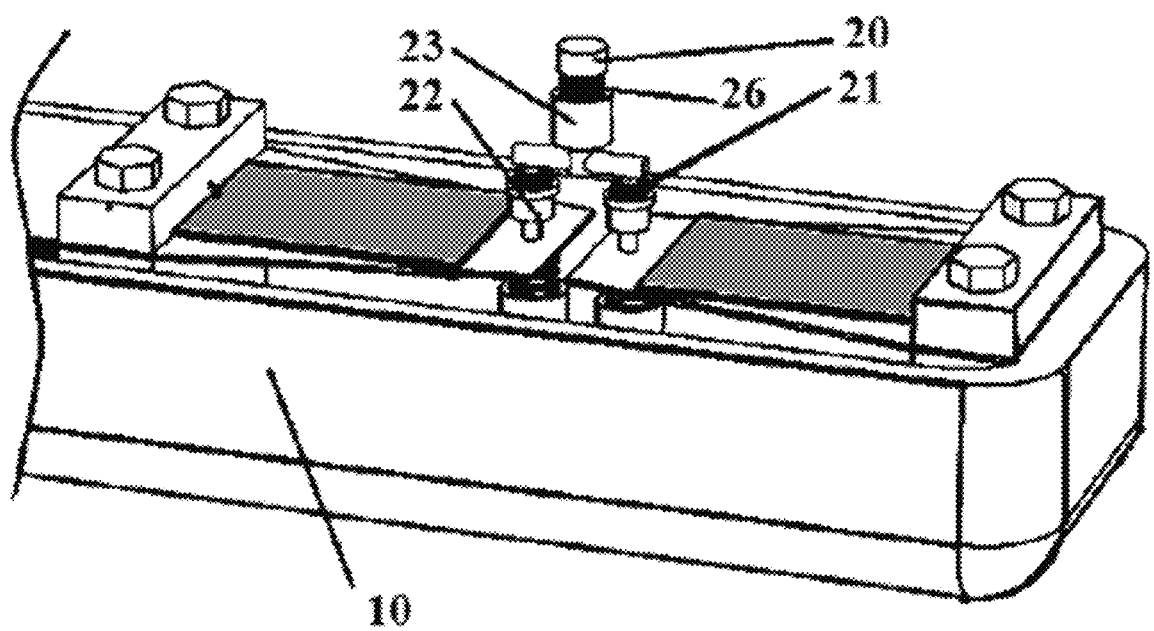
FIG. 3 is a structural diagram of a press mechanism of a remote control device according to an example of the disclosure.

As shown in FIG. 3, in another preferred example of the disclosure, the press element is a piezoelectric button 20, the piezoelectric button 20 is mounted on the housing, a pressure end of the piezoelectric button 20 is located on the surface of the housing, and a contact end of the piezoelectric button 20 is located inside the housing.

In the example of the disclosure, when using the device, the user presses the piezoelectric button 20, so that both ends at the bottom of the piezoelectric button 20 are pressed, thereby pressing the piezoelectric power generating mechanism. The piezoelectric power generating mechanism generates electricity, that is, alternating-current power is generated, which is finally supplied to the device after passing through the rectification circuit and the energy storage circuit.

The examples of the disclosure provide a remote control device. Once the piezoelectric button 20 is pressed, the pressure can be transferred to the piezoelectric power generating mechanism, so that the piezoelectric power generating mechanism generates electricity. By using the energy harvesting technology, a signal transmitting control board of the device is powered on, and therefore the device can be used for remote control.

Figure 4:
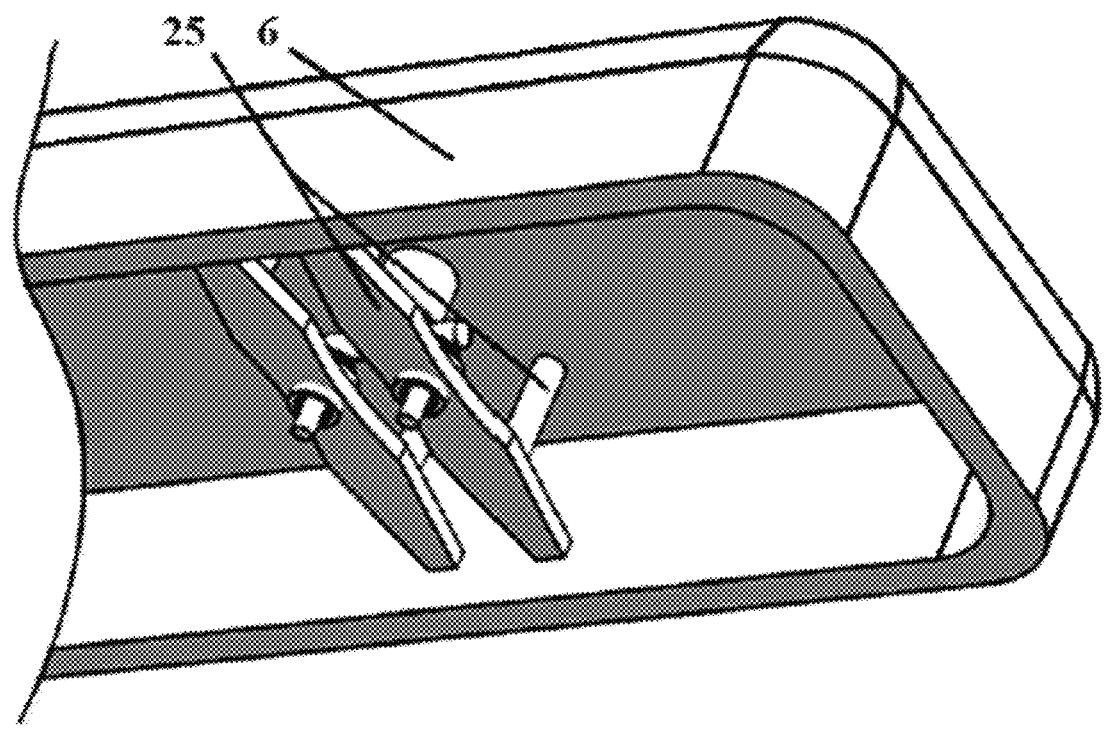
FIG. 4 is a structural diagram of a reset element of a remote control device according to an example of the disclosure.
Figure 5:
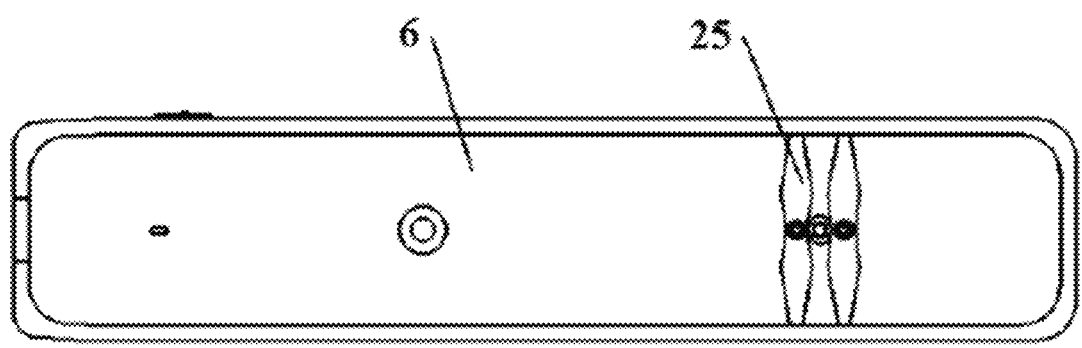
FIG. 5 is a structural diagram of an upper housing of a piezoelectric laser pointer according to an example of the disclosure.
Figure 6:
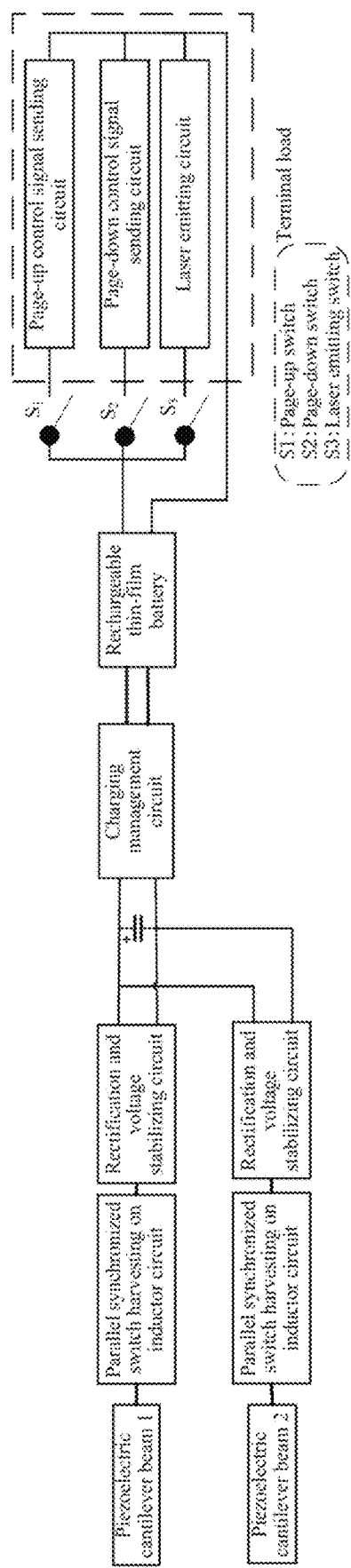
FIG. 6 is a block diagram of a circuit principle of a piezoelectric laser pointer according to an example of the disclosure.

As shown in FIG. 4, in another preferred example of the disclosure, the reset element includes two button support frames 25. The two button support frames 25 are mounted on an inner wall of the housing, a spring-B sleeve 22 is mounted on the surface of each button support frame 25, and a spring B 21 is nested in each spring-B sleeve 22. The spring-C sleeve 23 is mounted on the top of the two springs B 21. A spring C 26 is mounted in the spring-C sleeve 23. One end of the spring C 26 is connected to the contact end of the piezoelectric button 20. The press element is in contact with the piezoelectric power generating mechanism through the springs B 21. The spring-B sleeves and the spring-C sleeve are all fixedly mounted in the upper housing.

In the example of the disclosure, the button support frames 25, the spring-B sleeves 22, and the springs B 21 form the reset element. That is, after a compressing force on the compressed reset element disappears, the reset element can reset automatically. When the press element is compressed, the springs B 21 contract, and when the press element is no longer pressed, the springs B 21 reset, and drive the press element to return to the original position.

The examples of the disclosure provide a remote control device. when a vertically downward force acts on the press element, the press element receives an upward force from the reset element, that is, the springs B 21, so that the press element can reset, to be ready for next pressing. The remote control device is extremely convenient to use.

Figure 2:
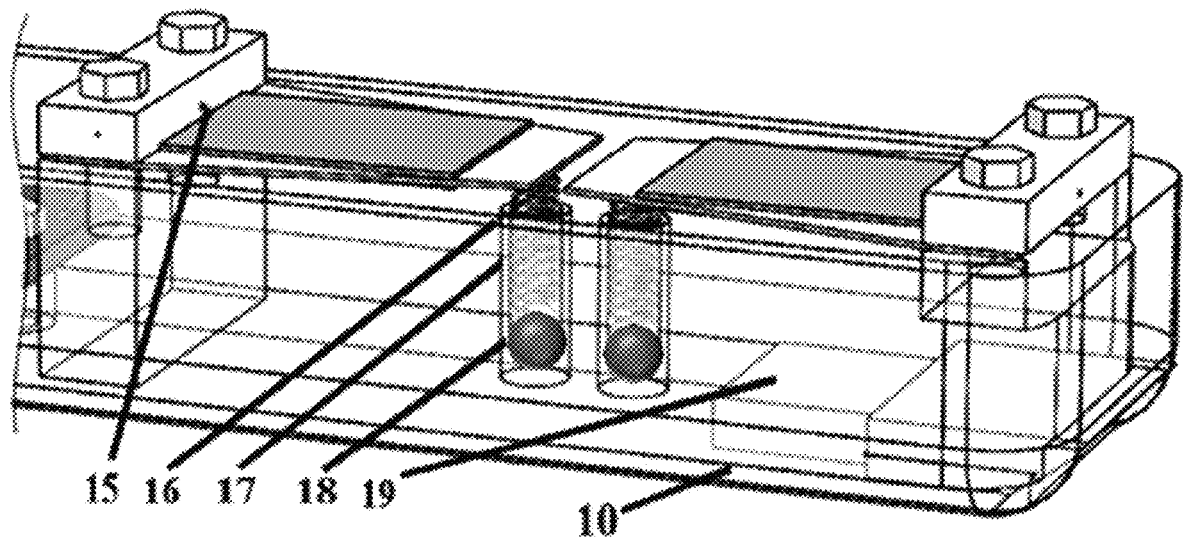
FIG. 2 is an enlarged structural diagram of a power generator of a remote control device according to an example of the disclosure.

As shown in FIG. 1 and FIG. 2, in another preferred example of the disclosure, the piezoelectric power generating mechanism includes two cantilever beam press plates 11. The two cantilever beam press plates 11 are mounted inside the housing. The two cantilever beam press plates 11 are provided with respective cantilever beams 13 on sides facing each other. Piezoelectric patches 12 are mounted on an upper surface and a lower surface of each cantilever beam 13 to form a piezoelectric cantilever beam. The two piezoelectric cantilever beams 13 are provided with respective springs A 16 at the bottom. Spring-A sleeves 17 are mounted inside the housing. A ball 18 is mounted inside each spring-A sleeve 17. A diameter of the ball 18 is greater than an outer diameter of the spring A 16. The spring A 16 is inserted in the spring-A sleeve 17, the bottom of the spring A 16 is in contact with the ball 18, and the top of the spring A 16 is in contact with the cantilever beam 13.

In the example of the disclosure, the cantilever beam press plate 11 is fixedly connected inside the housing through bolts 9. The cantilever beam 13, the piezoelectric patches 12, and the spring A 16 form a cantilever piezoelectric vibrator. During use, the user presses the press mechanism, the pressure of the press mechanism directly acts on a free end of the wedge-shaped cantilever piezoelectric vibrator. The free end of the cantilever piezoelectric vibrator vibrates, so that the piezoelectric material of the cantilever piezoelectric vibrator is deformed to generate electricity. The electricity passes through the circuit controller. Through the energy harvesting technology, power can be supplied to the remote control device. A cantilever beam substrate is made of beryllium bronze, and has a thickness of 0.3 mm to 1 mm. The piezoelectric material is lead zirconate titanate (PZT series 51), and has a thickness of 0.3 mm. The electrode lead is a stripped thin copper wire, where the cantilever beam is preferably a constant-strength trapezoidal beam or wedge-shaped beam.

The examples of the disclosure provide a remote control device. After being pressed by the press mechanism, the piezoelectric power generating mechanism can generate electricity, and the electricity passes through the circuit controller. Through the energy harvesting technology, power can be supplied to the device. An output amount of the electricity is related to the value of the stress on the material. After the device is powered on, a series of remote control operations can be performed.

As shown in FIG. 1, in another preferred example of the disclosure, a piezoelectric laser pointer includes a housing, and further includes:
 a power generator, mounted inside the housing and comprising a press mechanism and a piezoelectric power generating mechanism, wherein after being pressed by the press mechanism, the piezoelectric power generating mechanism is deformed under stress and generates electricity;
 a circuit controller, mounted inside the housing and electrically connected to the power generator;
 a signal transceiver, mounted inside the housing, electrically connected to the circuit controller, and configured to transmit signals, wherein the signal transceiver comprises a USB receiver configured to receive signals; and
 a laser emitter, mounted on the housing and electrically connected to the circuit controller, where a display screen 1 is mounted on the surface of the housing.

In the example of the disclosure, the display screen 1 is preferably a power supply display screen of the laser pointer. The circuit controller includes a power supply control circuit board 10 and a laser pointer circuit board 8. The circuit controller is connected to the laser emitter through a wire. The circuit controller includes the power supply control circuit board 10 and the laser pointer circuit board 8. The laser pointer circuit board 8 is fixedly connected inside the housing through bolts 9. Once the press mechanism is pressed, the piezoelectric power generating mechanism can generate electricity. Electric energy is collected through the parallel synchronized switch harvesting on inductor circuit, and through the rectification circuit and the storage circuit, the power supply control circuit board 10 is powered on. The electricity reaches the laser emitter through the wire, so that the laser emitter can be used. Further, the laser device is lit up and works in coordination with the signal transceiver, to facilitate corresponding operations.

The examples of the disclosure provide a piezoelectric laser pointer, which implements passive power supply of the laser emitter while reducing the use cost of dry batteries. This device achieves energy-efficient power generating, is environmental-friendly, does not cause any harm to human bodies, and is convenient to use.

As shown in FIG. 1, in another preferred example of the disclosure, the housing includes an upper housing 6 and a lower housing 14. An on-off key 5 is mounted on the surface of the upper housing 6, the circuit controller is provided with a corresponding on-off contact, and the on-off key 5 is electrically connected to the circuit controller through the on-off contact. The press mechanism includes a press element and a reset element. The press element is a piezoelectric button 20. The piezoelectric button 20 is mounted on the surface of the upper housing 6. A pressure end of the piezoelectric button 20 is located on the surface of the upper housing, and a contact end of the piezoelectric button 20 is located inside the housing. The reset element includes two button support frames 25. The two button support frames 25 are mounted on an inner wall of the upper housing 6. A spring-B sleeve 22 is mounted on the surface of each button support frame 25. A spring B 21 is nested in each spring-B sleeve 22. The spring-C sleeve 23 is mounted on the top of the two springs B 21. A spring C 26 is mounted in the spring-C sleeve 23. One end of the spring C 26 is connected to the contact end of the piezoelectric button 20, and the press element is in contact with the piezoelectric power generating mechanism through the springs B 21. The piezoelectric power generating mechanism includes two cantilever beam press plates 11. The two cantilever beam press plates 11 are mounted inside the lower housing 14. The two cantilever beam press plates 11 are provided with respective cantilever beams 13 on sides facing each other. Piezoelectric patches 12 are mounted on an upper surface and a lower surface of each cantilever beam 13, to form a piezoelectric cantilever beam. The two cantilever beams 13 are provided with respective springs A 16 at the bottom. Spring-A sleeves 17 are mounted inside the housing. A ball 18 is mounted inside each spring-A sleeve 17. A diameter of the ball 18 is greater than an outer diameter of the spring A 16. The spring A 16 is inserted in the spring-A sleeve 17. The bottom of the spring A 16 is in contact with the ball 18, and the top of the spring A 16 is in contact with the cantilever beam 13.

In the example of the disclosure, the piezoelectric button 20 is pressed with a finger to act on the cantilever beams 13, so that the cantilever beams 13 and the piezoelectric patches 12 vibrate. The piezoelectric patches 12 are deformed to generate electricity. One end of the electrode wire led out from the piezoelectric material is connected to the circuit controller. The diameter of the ball 18 is greater than that of the spring A 16. The spring A 16 is located inside the spring-A sleeve 17. During shaking, due to the mass of the ball 18, the ball 18 applies a force on the spring A 16, so that the spring A 16 "presses" the piezoelectric cantilever beam 13, where a relationship between stiffness factors of the spring A and spring B is $k_A < k_B$. The generated electricity passes through the rectification circuit and the storage circuit, and reaches the laser emitter through the wire, so that the laser emitter emits laser to work in coordination with the signal transceiver, thereby facilitating coordination with the multimedia device. Pressure applied by the user generates external vibration, which drives a piezoelectric bimorph cantilever beam harvester. Electricity is generated through a piezoelectric power generating beam 1 and a piezoelectric power generating beam 2 (piezoelectric patches 12), and enters a rectification and voltage-stabilizing circuit through a parallel synchronized switch harvesting on inductor circuit. The electricity then passes through a charging management circuit and a rechargeable thin-film battery, and finally enters a terminal load, including a page-up control signal sending circuit (page-up control switch $S_1$), a page-down control signal sending circuit (page-down control switch $S_2$), and a laser emitting circuit (laser emitting control switch $S_3$).

The examples of the disclosure provide a piezoelectric laser pointer. Power is generated with pressure, and the laser emitter is turned on to emit laser. A laser line may be used for indicating content displayed on the multimedia device. A laser point resides on the multimedia device, so that people focuses on content in a laser point region. The piezoelectric laser pointer is convenient to use.

As shown in FIG. 1, in another preferred example of the disclosure, the laser emitter includes a laser pointer chip, a laser pointer receiver 19 and a plurality of keys. The laser pointer chip is fixedly mounted in the lower housing 14. The laser pointer receiver is mounted in the lower housing 14. The keys are all mounted on the surface of the upper housing 6. Corresponding contacts are mounted on the surface of the circuit controller, and the keys are all connected to the corresponding contacts. Magnetic reed switches are mounted at tails of the keys.

In the example of the disclosure, the keys include a first key 2, a second key 3, a third key 4, and a fourth key 7. The first key 2 is preferably a page-up key of the laser pointer, the second key 3 is preferably a light-on key of the laser pointer, the third key 4 is preferably a page-down key of the laser pointer, and the fourth key 7 is preferably an on-off button of the laser pointer. The on-off key 5 is mounted on an outer wall on one side of the upper housing 6. The on-off button 7 of the laser pointer is connected to the laser pointer circuit board 8 through corresponding contacts. After being pressed by the press mechanism, the piezoelectric power generating mechanism generates power, and the power is connected to a power supply end of the laser pointer chip through a wire. After the on-off key 5 of the laser pointer is turned on, the laser pointer is controlled to turn a page or light up through the page-up key 2 of the laser pointer, the light-on key 3 of the laser pointer, the page-down key 4 of the laser pointer and the laser pointer receiver 19.

The examples of the disclosure provide a piezoelectric laser pointer. Passive power supply of the laser pointer is achieved. Electricity is generated through a polarization effect of the piezoelectric material, thereby realizing light-up and page turning functions of the laser pointer and also reducing the use cost of the dry batteries. No external power supply is required, thus achieving advantages such as integration, and avoiding disadvantages such as a large size of the dry battery and a high cost caused by frequent replacement of the dry battery, which do not match the delicate design of the laser pointer.

As shown in FIG. 1, in another example of the disclosure, a remote control system is provided. The remote control system includes:

a multimedia device; and
the remote control device or the piezoelectric laser pointer described above, where the remote control device or the piezoelectric laser pointer is wirelessly connected to the multimedia device, and the remote control device is configured to wirelessly control the multimedia device.

In the example of the disclosure, the remote control device or the piezoelectric laser pointer is used in coordination with the multimedia device, to wirelessly control the multimedia device.

The examples of the disclosure provide a remote control system, where on/off, playing and other operations of the multimedia device are controlled wirelessly. The operation is simple and convenient. It is unnecessary to use a battery. Power is generated with pressure, which is energy-saving and environmental-friendly.

The above are only the preferred examples of the disclosure, and are not intended to limit the disclosure. Any modifications, equivalent replacements and improvements and the like made within the spirit and principles of the disclosure shall fall within the protection scope of the disclosure.

What is claimed is:

1. A remote control device, comprising a housing, wherein the remote control device further comprises:
a power generator, mounted inside the housing and comprising a press mechanism and a power generating mechanism, wherein after being pressed by the press mechanism, the power generating mechanism is deformed under stress and generates electricity,
wherein the power generating mechanism comprises two cantilever beam pads, the two cantilever beam pads are mounted inside the housing, the two cantilever beam pads are provided with respective cantilever beams on sides facing each other, piezoelectric patches are mounted on an upper surface and a lower surface of each cantilever beam, the two cantilever beams are provided with respective springs A at the bottom, spring-A sleeves are mounted inside the housing, a steel ball is mounted inside each spring-A sleeve, a diameter of the steel ball is greater than a diameter of the spring A, the spring A is inserted in the spring-A sleeve, the bottom of the spring A is in contact with the steel ball, and the top of the spring A is in contact with the cantilever beam;
a circuit controller, mounted inside the housing and electrically connected to the power generator; and
a signal transceiver, mounted inside the housing, electrically connected to the circuit controller, and configured to transmit and receive signals.

2. The remote control device according to claim 1, wherein a plurality of keys are mounted on the surface of the housing, a plurality of corresponding contacts are mounted on the circuit controller, and the keys are electrically connected to the circuit controller through the contacts.

3. The remote control device according to claim 1, wherein the press mechanism comprises a press element and a reset element.

4. The remote control device according to claim 3, wherein the press element is a piezoelectric button, the piezoelectric button is mounted on the housing, a pressure end of the piezoelectric button is located on the surface of the housing, and a contact end of the piezoelectric button is located inside the housing.

5. The remote control device according to claim 3, wherein the reset element comprises two button support frames, the two button support frames are mounted on an inner wall of an upper housing, a spring-B sleeve is mounted on the surface of each button support frame, a spring B is nested in each spring-B sleeve, a spring-C sleeve is mounted on the top of the two springs B, a spring C is mounted inside the spring-C sleeve, one end of the spring C is connected to the contact end of the piezoelectric button, and the press element is in contact with the power generating mechanism through the springs B.

6. A remote control system, comprising: a multimedia device; and the remote control device according to claim 1, wherein the remote control device is wirelessly connected to the multimedia device, and the remote control device is configured to wirelessly control the multimedia device.

7. The remote control system according to claim 6, wherein a plurality of keys are mounted on the surface of the housing, a plurality of corresponding contacts are mounted on the circuit controller, and the keys are electrically connected to the circuit controller through the contacts.

8. The remote control system according to claim 6, wherein the press mechanism comprises a press element and a reset element.

9. The remote control system according to claim 8, wherein the press element is a piezoelectric button, the piezoelectric button is mounted on the housing, a pressure end of the piezoelectric button is located on the surface of the housing, and a contact end of the piezoelectric button is located inside the housing.

10. The remote control system according to claim 8, wherein the reset element comprises two button support frames, the two button support frames are mounted on an inner wall of an upper housing, a spring-B sleeve is mounted on the surface of each button support frame, a spring B is nested in each spring-B sleeve, a spring-C sleeve is mounted on the top of the two springs B, a spring C is mounted inside the spring-C sleeve, one end of the spring C is connected to the contact end of the piezoelectric button, and the press element is in contact with the power generating mechanism through the springs B.

11. A piezoelectric laser pointer, comprising a housing, wherein the piezoelectric laser pointer further comprises:
    a power generator, mounted inside the housing and comprising a press mechanism and a power generating mechanism, wherein after being pressed by the press mechanism, the power generating mechanism is deformed under stress and generates electricity;
    a circuit controller, mounted inside the housing and electrically connected to the power generator;
    a signal transceiver, mounted inside the housing, electrically connected to the circuit controller, and configured to transmit signals, wherein the signal transceiver comprises a USB receiver configured to receive signals; and
    a laser emitter, mounted on the housing and electrically connected to the circuit controller, wherein a display screen is mounted on the surface of the housing;
    wherein the housing comprises an upper housing and a lower housing; an on-off key is mounted on the surface of the upper housing, the circuit controller is provided with a corresponding on-off contact, and the on-off key is electrically connected to the circuit controller through the on-off contact; the press mechanism comprises a press element and a reset element, the press element is a piezoelectric button, the piezoelectric button is mounted on the surface of the upper housing, a pressure end of the piezoelectric button is located on the surface of the upper housing, and a contact end of the piezoelectric button is located inside the housing; the reset element comprises two button support frames, the two button support frames are mounted on an inner wall of the upper housing, a spring-B sleeve is mounted on the surface of each button support frame, a spring B is nested in each spring-B sleeve, a spring-C sleeve is mounted on the top of the two springs B, a spring C is mounted inside the spring-C sleeve, one end of the spring C is connected to the contact end of the piezoelectric button, and the press element is in contact with the power generating mechanism through the springs B; the power generating mechanism comprises two cantilever beam pads, the two cantilever beam pads are mounted inside the lower housing, the two cantilever beam pads are provided with respective cantilever beams on sides facing each other, piezoelectric patches are mounted on an upper surface and a lower surface of each cantilever beam, the two cantilever beams are provided with respective springs A at the bottom, spring-A sleeves are mounted inside the housing, a steel ball is mounted inside each spring-A sleeve, a diameter of the steel ball is greater than a diameter of the spring A, the spring A is inserted in the spring-A sleeve, the bottom of the spring A is in contact with the steel ball, and the top of the spring A is in contact with the cantilever beam.

12. The piezoelectric laser pointer according to claim 11, wherein the laser emitter comprises a laser pointer chip, a laser pointer receiver, and a plurality of keys; the laser pointer chip is fixedly mounted in the lower housing, the laser pointer receiver is mounted inside the lower housing, the keys are all mounted on the surface of the upper housing, corresponding contacts are mounted on the surface of the circuit controller, and the keys are all connected to the corresponding contacts.

13. A remote control system, comprising: a multimedia device; and the piezoelectric laser pointer according to claim 11, wherein the piezoelectric laser pointer is wirelessly connected to the multimedia device.

14. The remote control system according to claim 13, wherein the laser emitter comprises a laser pointer chip, a laser pointer receiver, and a plurality of keys; the laser pointer chip is fixedly mounted in the lower housing, the laser pointer receiver is mounted inside the lower housing, the keys are all mounted on the surface of the upper housing, corresponding contacts are mounted on the surface of the circuit controller, and the keys are all connected to the corresponding contacts.

* * * * *